(12) United States Patent
Wu et al.

(10) Patent No.: US 12,407,363 B2
(45) Date of Patent: Sep. 2, 2025

(54) CONTINUOUS-TIME DELTA-SIGMA MODULATOR

(71) Applicant: REALTEK SEMICONDUCTOR CORPORATION, Hsinchu (TW)

(72) Inventors: Yan-Hui Wu, New Taipei (TW);
Yao-Ming Lu, Taoyuan (TW);
Tai-Cheng Lee, Taipei (TW);
Chih-Lung Chen, Hsinchu (TW);
Sheng-Yen Shih, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 176 days.

(21) Appl. No.: 18/519,104

(22) Filed: Nov. 27, 2023

(65) Prior Publication Data
US 2024/0213999 A1    Jun. 27, 2024

(30) Foreign Application Priority Data

Dec. 21, 2022  (TW) .................................. 111149259

(51) Int. Cl.
*H03M 1/46* (2006.01)
*H03M 1/06* (2006.01)

(52) U.S. Cl.
CPC ......... *H03M 1/462* (2013.01); *H03M 1/0604* (2013.01); *H03M 1/0626* (2013.01)

(58) Field of Classification Search
CPC ... H03M 1/462; H03M 1/0604; H03M 1/0626
USPC .......................................... 341/118, 143, 155
See application file for complete search history.

(56) References Cited

U.S. PATENT DOCUMENTS 9,455,737 B1 *  9/2016  Rajaee ................... H03M 3/464
11,626,885 B1 *  4/2023  Liu ........................ H03M 3/426
                                                                341/143

OTHER PUBLICATIONS

O. Rajaee et al., "Design of a 79 dB 80 MHz 8X-OSR Hybrid Delta-Sigma/Pipelined ADC," in IEEE Journal of Solid-State Circuits, vol. 45, No. 4, pp. 719-730, Apr. 2010.
S. Ho, C.-L. Lo, J. Ru and J. Zhao, "A 23 mW, 73 dB Dynamic Range, 80 MHz BW Continuous-Time Delta-Sigma Modulator in 20 nm CMOS," in IEEE Journal of Solid-State Circuits, vol. 50, No. 4, pp. 908-919, Apr. 2015.

(Continued)

*Primary Examiner* — Khai M Nguyen
(74) *Attorney, Agent, or Firm* — WPAT, PC

(57) ABSTRACT

A continuous-time delta-sigma modulator (CT-DSM) includes a loop filter, a pipelined successive-approximation register analog-to-digital converter (SAR ADC), a feedback circuit, an excess loop delay (ELD) compensation circuit, and a logic circuit. The loop filter generates a first intermediate signal according to an input signal, a feedback signal, and a compensation signal. The pipelined SAR ADC generates a first digital code, a second digital code, a first quantization error signal, and a second quantization error signal according to the first intermediate signal. The feedback circuit generates the feedback signal according to the first digital code, the first quantization error signal, and the second quantization error signal. The ELD compensation circuit generates the compensation signal according to at least one output signal of the feedback circuit. The logic circuit generates an output digital code according to the first digital code and the second digital code.

10 Claims, 9 Drawing Sheets

(56) References Cited

OTHER PUBLICATIONS

T. He, M. Ashburn, S. Ho, Y. Zhang and G. Temes, "A 50MHZ-BW continuous-time ΔΣADC with dynamic error correction achieving 79.8dB SNDR and 95.2dB SFDR," 2018 IEEE International Solid-State Circuits Conference—(ISSCC), 2018, pp. 230-232.

S.-H. Wu, T.-K. Kao, Z.-M. Lee, P. Chen and J.-Y. Tsai, "A 160MHz-BW 72dB-DR 40mW continuous-time ΔΣmodulator in 16nm CMOS with analog ISI-reduction technique," 2016 IEEE International Solid-State Circuits Conference (ISSCC), 2016, pp. 280-281.

W. Wang, C.-H. Chan, Y. Zhu and R. P. Martins,"A 100-MHz BW 72.6-dB-SNDR CT ΔΣModulator Utilizing Preliminary Sampling and Quantization," in IEEE Journal of Solid-State Circuits, vol. 55, No. 6, pp. 1588-1598, Jun. 2020.

Tao Jiang, Wing Liu, F. Y. Zhong, Charlie Zhong and P. Y. Chiang, "Single-channel, 1.25-GS/s, 6-bit, loop-unrolled asynchronous SAR-ADC in 40nm-CMOS," IEEE Custom Integrated Circuits Conference 2010, 2010, pp. 1-4.

B. P. Ginsburg and A. P. Chandrakasan, "500-MS/s 5-bit ADC in 65-nm CMOS With Split Capacitor Array DAC," in IEEE Journal of Solid-State Circuits, vol. 42, No. 4, pp. 739-747, Apr. 2007.

C. Liu, S. Chang, G. Huang, Y. Lin and C. Huang, "A 1V 11fJ/conversion-step 10bit 10MS/s asynchronous SAR ADC in 0.18μm CMOS," 2010 Symposium on VLSI Circuits, 2010, pp. 241-242.

J. Lin, M. Miyahara and A. Matsuzawa, "A 15.5 dB, wide signal swing, dynamic amplifier using a common-mode voltage detection technique," 2011 IEEE International Symposium of Circuits and Systems (ISCAS), 2011, pp. 21-24.

M. Zhang, Q. Liu, X. Fan, "Gain-boosted dynamic amplifier for pipelined-SAR ADCs," Electronic Letters, vol. 53, No. 11, 2017.

G. Mitteregger, C. Ebner, S. Mechnig, T. Blon, C. Holuigue and E. Romani, "A 20-mW 640-MHz CMOS Continuous-TimeΣΔ ADC With 20-MHz Signal Bandwidth, 80-dB Dynamic Range and 12-bit ENOB," in IEEE Journal of Solid-State Circuits, vol. 41, No. 12, pp. 2641-2649, Dec. 2006.

J. De Maeyer, J. Raman, P. Rombouts and L. Weyten, "STF behaviour in a CT ΔΣmodulator," 2005 12th IEEE International Conference on Electronics, Circuits and Systems, 2005, pp. 1-4.

Yan Song et al., "A 2.56mW 40MHz-Bandwidth 75dB-SNDR Partial-Interleaving SAR-Assisted NS Pipeline ADC With Background Inter-Stage Offset Calibration", 2020, IEEE International Solid-State Circuits Conference.

Yan Song1 et al., "A 2.56mW 40MHz-Bandwidth 75dB-SNDR Partial-Interleaving SAR-Assisted NS Pipeline ADC With Background", ISSCCSep. 2020_Visuals—247-294, 2020, IEEE.

* cited by examiner

CONTINUOUS-TIME DELTA-SIGMA MODULATOR

BACKGROUND OF THE INVENTION

1. Field of the Invention

The present invention generally relates to delta-sigma modulator (DSM), and, more particularly, to a continuous-time DSM (CT-DSM).

2. Description of Related Art

Compared to a discrete-time delta-sigma modulator (DT-DSM), the CT-DSM essentially has the advantage of anti-aliasing. In this field, the design of an excellent CT-DSM has become an important issue.

SUMMARY OF THE INVENTION

In view of the issues of the prior art, an object of the present invention is to provide a continuous-time delta-sigma modulator (CT-DSM), so as to make an improvement to the prior art.

According to one aspect of the present invention, a CT-DSM is provided. The CT-DSM includes a loop filter, a pipelined successive-approximation register analog-to-digital converter (SAR ADC), a feedback circuit, an excess loop delay (ELD) compensation circuit, and a logic circuit. The loop filter generates a first intermediate signal according to an input signal, a feedback signal, and a compensation signal. The pipelined SAR ADC is coupled to the loop filter and configured to generate a first digital code, a second digital code, a first quantization error signal, and a second quantization error signal according to the first intermediate signal. The feedback circuit is coupled to the pipelined SAR ADC and configured to generate the feedback signal according to the first digital code, the first quantization error signal, and the second quantization error signal. The ELD compensation circuit is coupled to the feedback circuit and the loop filter and configured to generate the compensation signal according to at least one output signal of the feedback circuit. The logic circuit is coupled to the pipelined SAR ADC and configured to generate an output digital code according to the first digital code and the second digital code.

The technical means embodied in the embodiments of the present invention can solve at least one of the problems of the prior art. Therefore, compared to the prior art, the present invention increases the number of quantizer bits without increasing the complexity of the circuit.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes a continuous-time delta-sigma modulator (CT-DSM). On account of that some or all elements of the CT-DSM could be known, the detail of such elements is omitted provided that such detail has little to do with the features of this disclosure, and that this omission nowhere dissatisfies the specification and enablement requirements. A person having ordinary skill in the art can choose components equivalent to those described in this specification to carry out the present invention, which means that the scope of this invention is not limited to the embodiments in the specification.

Figure 1:
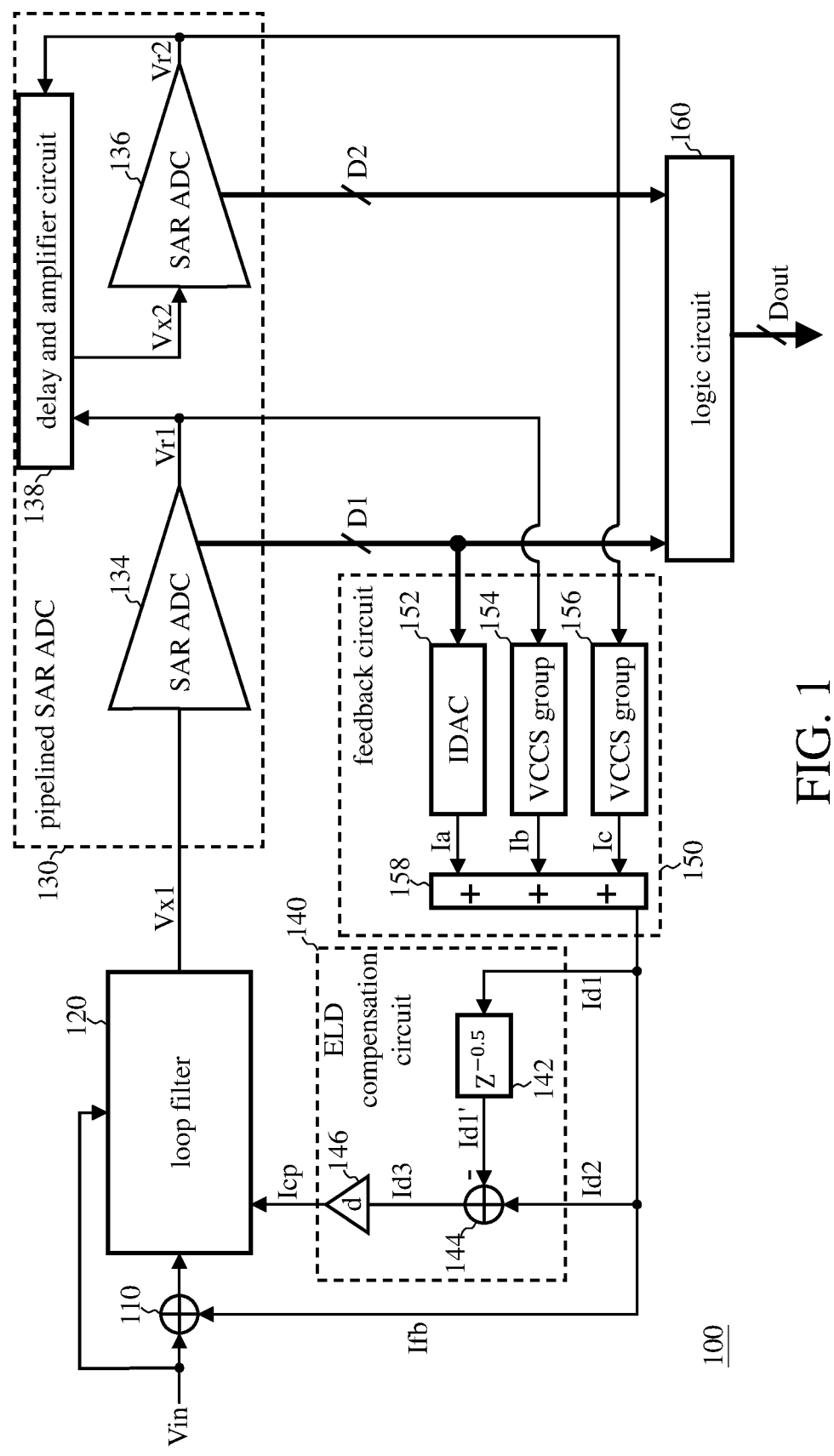
FIG. 1 is a functional block diagram of a continuous-time delta-sigma modulator (CT-DSM) according to an embodiment of the present invention.

FIG. 1 is a functional block diagram of a CT-DSM 100 according to an embodiment of the present invention. The CT-DSM 100 includes a loop filter 120, a pipelined (or pipeline) successive-approximation register (SAR) analog-to-digital converter (ADC) 130, an excess loop delay (ELD) compensation circuit 140, a feedback circuit 150, and a logic circuit 160.

In some embodiments, the loop filter 120 may be a two-stage loop filter, and the compensation signal Icp outputted by the ELD compensation circuit 140 may be inputted to the second stage of the loop filter 120 to avoid adding the additional adder circuit. The output of the adder circuit 110 (i.e., the combination of the input signal Vin and the feedback signal Ifb) is one of the input signals of the loop filter 120. In addition, the loop filter 120 generates the intermediate signal Vx1 further according to the input signal Vin (as a feed-forward signal) and the compensation signal Icp. The operational details of the loop filter 120 are well known to people having ordinary skill in the art, so they are omitted herein for brevity.

The pipelined SAR ADC 130 generates a digital code D1, a digital code D2, a quantization error signal Vr1, and a quantization error signal Vr2 according to the intermediate signal Vx1. The pipelined SAR ADC 130 includes a SAR ADC 134, a SAR ADC 136, and a delay and amplifier circuit 138. The SAR ADC 134 can be used as a quantizer in a single loop delta-sigma modulator (DSM). The SAR ADC 134 generates the digital code D1 and the quantization error signal Vr1 according to the intermediate signal Vx1. The SAR ADC 136 generates the digital code D2 and the quantization error signal Vr2 according to the intermediate signal Vx2. In some embodiments, if the intermediate signal Vx2 is likely to be too large, the digital code D2 may contain N (e.g., 2) redundancy bits to ensure the correctness of the final output digital code Dout. The delay and amplifier circuit 138 is used for implementing the noise transfer function (NTF) of the pipelined SAR ADC 130 and generating an intermediate signal Vx2 according to the quantization error signal Vr1 and the quantization error signal Vr2.

The feedback circuit 150 is used for generating output signals (including a feedback signal Ifb, a feedback signal Id1, and a feedback signal Id2) according to the digital code D1, the quantization error signal Vr1, and the quantization error signal Vr2. The feedback circuit 150 includes a current digital-to-analog converter (IDAC) 152, a voltage-controlled current source (VCCS) group 154, a VCCS group 156, and an adder circuit 158. The IDAC 152 is used for generating a feedback current Ia according to the digital code D1. The VCCS group 154 is used for generating a feedback current Ib according to the quantization error signal Vr1. The VCCS group 156 is used for generating a feedback current Ic according to the quantization error signal Vr2. The adder circuit 158 adds the feedback current Ia, the feedback current Ib, and the feedback current Ic to generate the output signals.

The ELD compensation circuit 140 includes a delay circuit 142, an adder circuit 144, and an amplifier circuit 146. The ELD compensation circuit 140 is used for generating the compensation signal Icp according to the output signals of the feedback circuit 150 (specifically, according to the feedback signal Id1 and the feedback signal Id2). More specifically, the delay circuit 142 delays the feedback signal Id1 to generate a delayed feedback signal Id1'. The adder circuit 144 subtracts the delayed feedback signal Id1' from the feedback signal Id2 to generate a feedback signal Id3 (Id3=Id2−Id1'). The amplifier circuit 146 amplifies the feedback signal Id3 to generate the compensation signal Icp. The component of the feedback signal Id1, the component of the feedback signal Id2, and the component of the feedback signal Ifb each include the feedback current Ia, a part of the feedback current Ib, and a part of the feedback current Ic. The operating principle of the ELD compensation circuit 140 is well known to people having ordinary skill in the art, and the details are omitted herein for brevity.

The logic circuit 160 is used for generating the output digital code Dout according to the digital code D1 and the digital code D2. In some embodiments (which are intended to illustrate the invention by way of example, but not to limit the scope of the claimed invention), the digital code D1 is four bits, the digital code D2 is five bits, and the output digital code Dout is nine bits. In some embodiments, the logic circuit 160 includes a decoder and a register and is used for performing bit alignment and error correction. The operating principle of the logic circuit 160 is well known to people having ordinary skill in the art, so the details are omitted herein for brevity.

Figure 2:
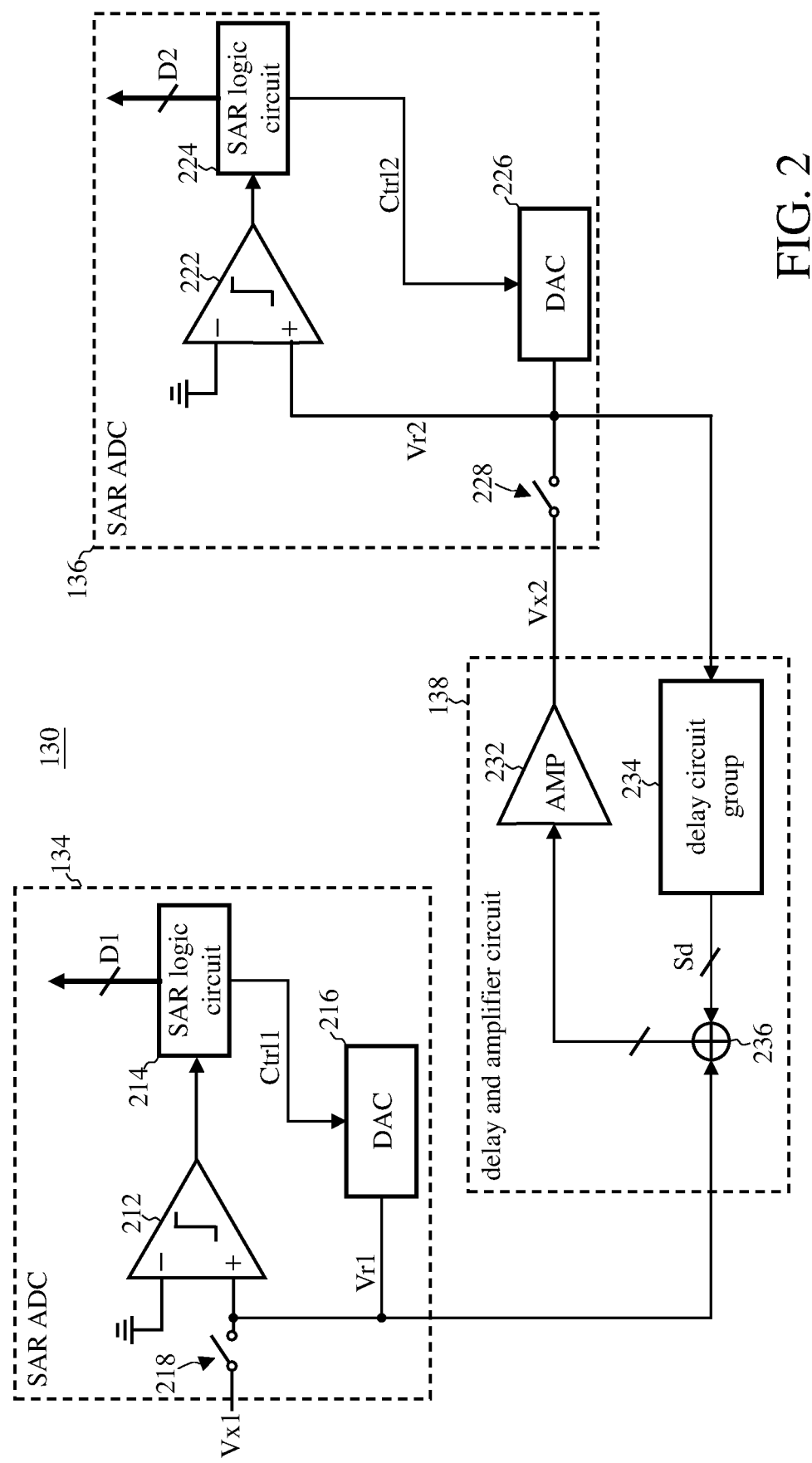
FIG. 2 shows a functional block diagram of a pipelined successive-approximation register (SAR) analog-to-digital converter (ADC) according to an embodiment of the present invention.

FIG. 2 shows a functional block diagram of the pipelined SAR ADC 130 according to an embodiment of the present invention.

The SAR ADC 134 includes a comparator 212, a SAR logic circuit 214, a digital-to-analog converter (DAC) 216 (e.g., a switched-capacitor DAC), and a switch 218. The switch 218 is used for sampling the intermediate signal Vx1.

The comparator 212 is used for generating a comparison result according to the intermediate signal Vx1. The SAR logic circuit 214 generates the control signal Ctrl1 and a part of the digital code D1 according to the comparison result. The DAC 216 changes the states of its internal switches according to the control signal Ctrl1; as a result, the quantization error signal Vr1 changes. In the next round of operation, the comparator 212 generates a comparison result according to the quantization error signal Vr1. The SAR ADC 134 repeats the above operations until all bits of the digital code D1 are generated, and then samples the intermediate signal Vx1 again.

The SAR ADC 136 includes a comparator 222, a SAR logic circuit 224, a DAC 226, and a switch 228. The SAR ADC 136 is similar to the SAR ADC 134. Since the operational details of the SAR ADC 134 and the SAR ADC 136 are well known to people having ordinary skill in the art, they are omitted herein for brevity.

The delay and amplifier circuit 138 includes an amplifier 232, a delay circuit group 234, and an adder circuit 236. The delay circuit group 234 is used for delaying the quantization error signal Vr2 to generate multiple delayed signals Sd. The adder circuit 236 is used for adding the quantization error signal Vr1 and the delayed signals Sd. The amplifier 232 is used for amplifying the quantization error signal Vr1 and the delayed signals Sd to generate the intermediate signal Vx2.

Figure 3:
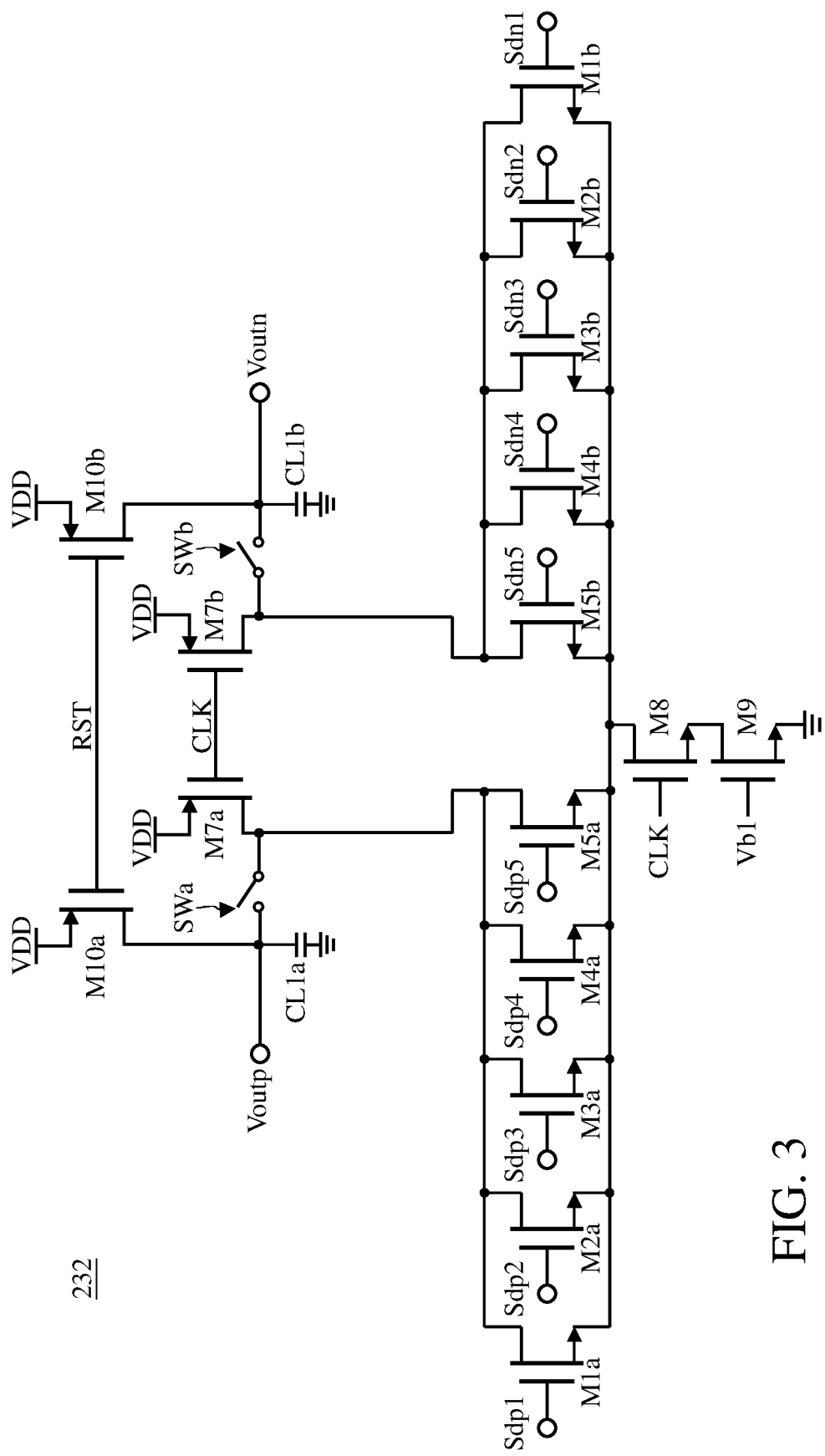
FIG. 3 shows a functional block diagram of an amplifier according to an embodiment of the present invention.

FIG. 3 shows a functional block diagram of the amplifier 232 according to an embodiment of the present invention. The amplifier 232 includes multiple input transistor pairs (there are five input transistor pairs in the example of FIG. 3: the transistors M1a and M1b, the transistors M2a and M2b, the transistors M3a and M3b, the transistors M4a and M4b, and the transistors M5a and M5b), a first transistor pair (including the transistors M7a and M7b), a second transistor pair (including the transistors M10a and M10b), a switch SWa, a switch SWb, a capacitor CL1a, a capacitor CL1b, a transistor M8, and a transistor M9.

Each transistor has a gate (control terminal), a source, and a drain. The sources of the transistor M1a, the transistor M2a, the transistor M3a, the transistor M4a, the transistor M5a, the transistor M1b, the transistor M2b, the transistor M3b, the transistor M4b, and the transistor M5b are coupled or electrically connected to each other and are coupled to a reference voltage (e.g., ground) through the transistor M8 and the transistor M9. The drains of the transistor M1a, the transistor M2a, the transistor M3a, the transistor M4a, and the transistor M5a are coupled or electrically connected to each other. The drains of the transistor M1b, the transistor M2b, the transistor M3b, the transistor M4b and the transistor M5b are coupled or electrically connected to each other. The gate of the transistor M8 receives (or is coupled to) a clock CLK. The gate of the transistor M9 receives a reference voltage Vb1.

The signal Sdp1 and the signal Sdn1 are a differential signal pair. The signal Sdp2 and the signal Sdn2 are a differential signal pair. The signal Sdp3 and the signal Sdn3 are a differential signal pair. The signal Sdp4 and the signal Sdn4 are a differential signal pair. The signal Sdp5 and the signal Sdn5 are a differential signal pair. The gate of the transistor Mia receives the signal Sdpi, and the gate of the transistor Mib receives the signal Sdni (i=1, 2, 3, 4, 5). In the following discussion, the signal Sdp1 and the signal Sdn1 correspond to the quantization error signal Vr1, and the other signals (the signal Sdpj and the signal Sdnj, j=2, 3, 4, 5) correspond to the delayed signals Sd that the delay circuit group 234 generates by delaying the quantization error signal Vr2.

The transistor M7a and the transistor M7b form an amplifier stage of the amplifier 232 and operate according to the clock CLK (i.e., their gates receive the clock CLK). The switch SWa and the switch SWb also operate according to the clock CLK. The drain of the transistor M7a is coupled or electrically connected to the drains of the transistors M1a to M5a. The drain of the transistor M7b is coupled or electrically connected to the drains of the transistors M1b to M5b. Both the source of the transistor M7a and the source of the transistor M7b receive a reference voltage (e.g., a power supply voltage VDD).

The capacitor CL1a is coupled or electrically connected to the output terminal Voutp of the amplifier 232, and the capacitor CL1b is coupled or electrically connected to the output terminal Voutn of the amplifier 232.

The gate of the transistor M10a and the gate of the transistor M10b receive the reset signal RST. The source of the transistor M10a and the source of the transistor M10b receive the power supply voltage VDD. The drain of the transistor M10a is coupled or electrically connected to the capacitor CL1a and the output terminal Voutp. The drain of the transistor M10b is coupled or electrically connected to the capacitor CL1b and the output terminal Voutn. The transistor M10a and the transistor M10b reset the output terminal Voutp and the output terminal Voutn to the power supply voltage VDD according to the reset signal RST.

The gain ratio of the input transistor pairs can be adjusted by controlling their respective aspect ratios. More specifically, if the sizes of the transistors M1a, M2a, M3a, M4a, M5a (or M1b, M2b, M3b, M4b, M5b) are in the ratio A1:A2:A3:A4:A5 (i.e., their transconductances (gm) are also in the ratio A1:A2:A3:A4:A5), then the gains for the differential signal Sd1 (including the signal Sdp1 and the signal Sdn1), the differential signal Sd2 (including the signal Sdp2 and the signal Sdn2), the differential signal Sd3 (including the signal Sdp3 and the signal Sdn3), the differential signal Sd4 (including the signal Sdp4 and the signal Sdn4), and the differential signal Sd5 (including the signal Sdp5 and the signal Sdn5) are in the ratio A1:A2:A3:A4:A5.

The gain GA1 of the amplifier of FIG. 3 is shown in equation (1).

$$GA1 = \frac{Voutp - Voutn}{\sum_{i=1}^{5} \frac{Ai}{Aall} \Delta V_{INi}} = \frac{gm}{I8}(VDD - Vcm) \quad (1)$$

where Aall=A1+A2+A3+A4+A5, $\Delta V_{INi}$=Sdpi−Sdni, I8 is the current flowing through the transistor M8, Voutp and Voutn are the voltages of the output terminal Voutp and the output terminal Voutn, respectively.

Figure 4:
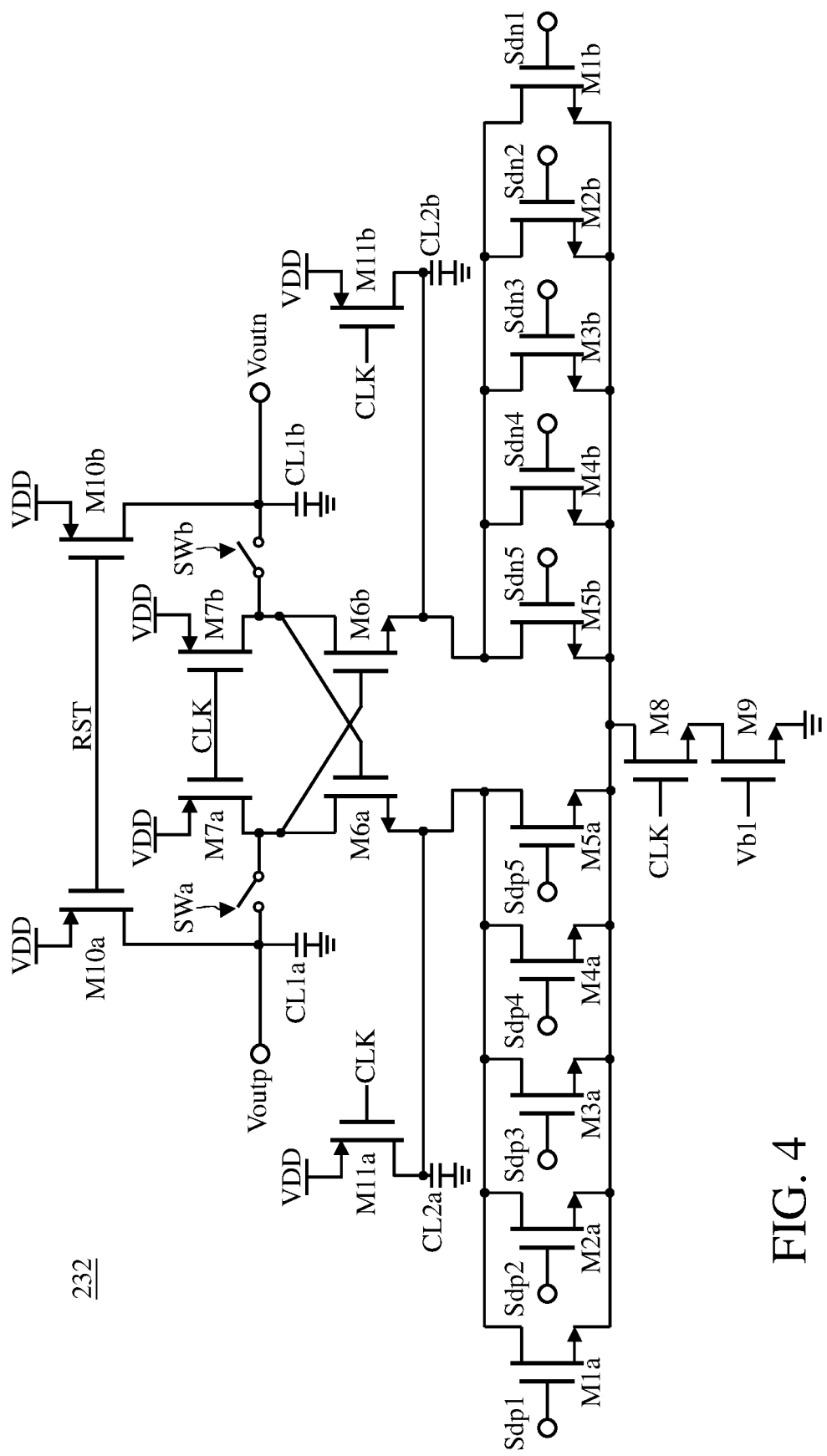
FIG. 4 shows a functional block diagram of an amplifier according to another embodiment of the present invention.

FIG. 4 shows a functional block diagram of the amplifier 232 according to another embodiment of the present invention. FIG. 4 is a cross-couple cascode (CCC) amplifier. In comparison with FIG. 3, the amplifier 232 in FIG. 4 further includes a third transistor pair (including the transistor M6a and the transistor M6b), a fourth transistor pair (including the transistor M11a and the transistor M11b), the capacitor CL2a, and the capacitor CL2b. The gate of the transistor M6a is coupled or electrically connected to the drain of the transistor M6b and the drain of the transistor M7b. The gate of the transistor M6b is coupled or electrically connected to the drain of the transistor M6a and the drain of the transistor M7a. The drain of the transistor M6a is coupled or electrically connected to the drain of the transistor M7a. The drain of the transistor M6b is coupled or electrically connected to the drain of the transistor M7b. The source of the transistor M6a is coupled or electrically connected to one terminal of the input transistor pairs (the drain of the transistor Mia, i=1, 2, 3, 4, 5). The source of the transistor M6b is coupled or electrically connected to one terminal of the input transistor pairs (the drain of the transistor Mib, i=1, 2, 3, 4, 5).

The transistor M11a and the capacitor CL2a are connected in series between the power supply voltage VDD and ground. The transistor M11b and the capacitor CL2b are connected in series between the power supply voltage VDD and ground. The gates of the transistor M11a and the transistor M11b both receive the clock CLK. One terminal of the capacitor CL2a is coupled or electrically connected to the source of the transistor M6a and the drain of the transistor M11a. One terminal of the capacitor CL2b is coupled or electrically connected to the source of the transistor M6b and the drain of the transistor M11b. People having ordinary skill in the art can know the operating principle of the amplifier 232 through the connection of the components in FIG. 4, so the details are omitted herein for brevity.

If the capacitor CL1a and the capacitor CL1b have a capacitance value of C1, and the capacitor CL2a and the capacitor CL2b have a capacitance value of C2, then the gain GA2 of the amplifier in FIG. 4 is shown in equation (2).

$$GA2 = \frac{Voutp - Voutn}{\sum_{i=1}^{5} \frac{Ai}{Aall} \Delta V_{INi}} = \frac{gm}{I8}(VDD - Vcm)\left(1 + \frac{C2}{C1 - C2}\right) \quad (2)$$

According to equations (1) and (2), the amplifier in FIG. 4 has a higher gain than the amplifier in FIG. 3.

Figure 5:
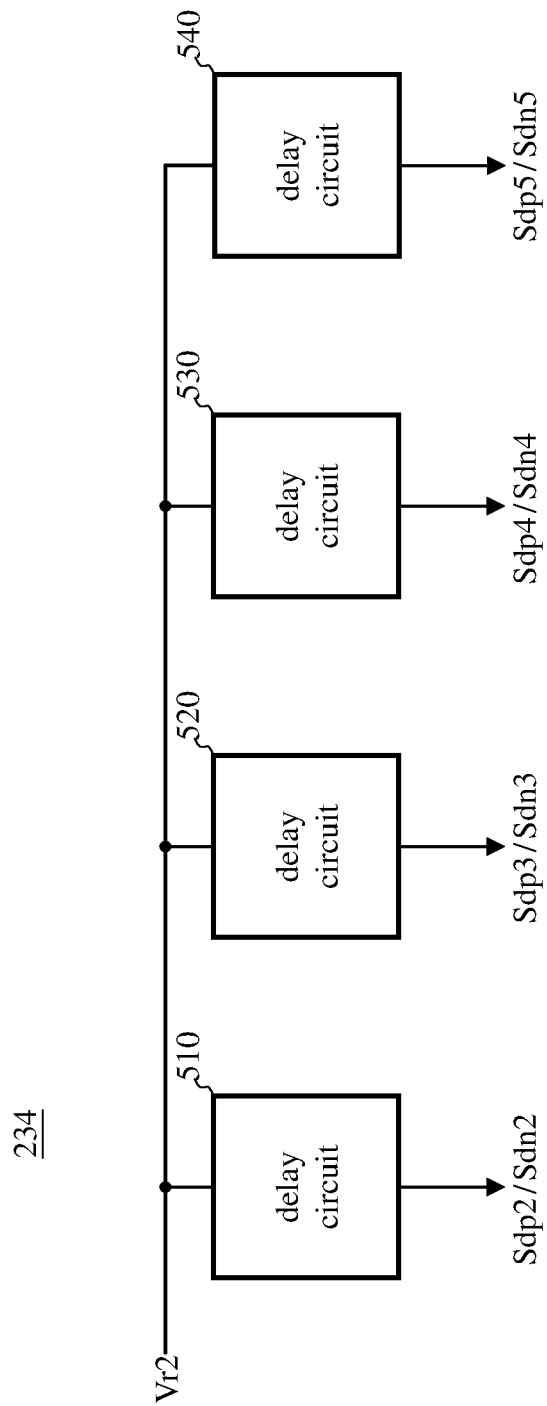
FIG. 5 shows a functional block diagram of a delay circuit group according to an embodiment of the present invention.

FIG. 5 shows a functional block diagram of the delay circuit group 234 according to an embodiment of the present invention. The delay circuit group 234 includes a delay circuit 510, a delay circuit 520, a delay circuit 530, and a delay circuit 540. The delay circuit 510, the delay circuit 520, the delay circuit 530, and the delay circuit 540 are used for delaying the quantization error signal Vr2 to generate the signal Sdp2 (or signal Sdn2), the signal Sdp3 (or signal Sdn3), the signal Sdp4 (or signal Sdn4), and the signal Sdp5 (or signal Sdn5), respectively.

Figure 6:
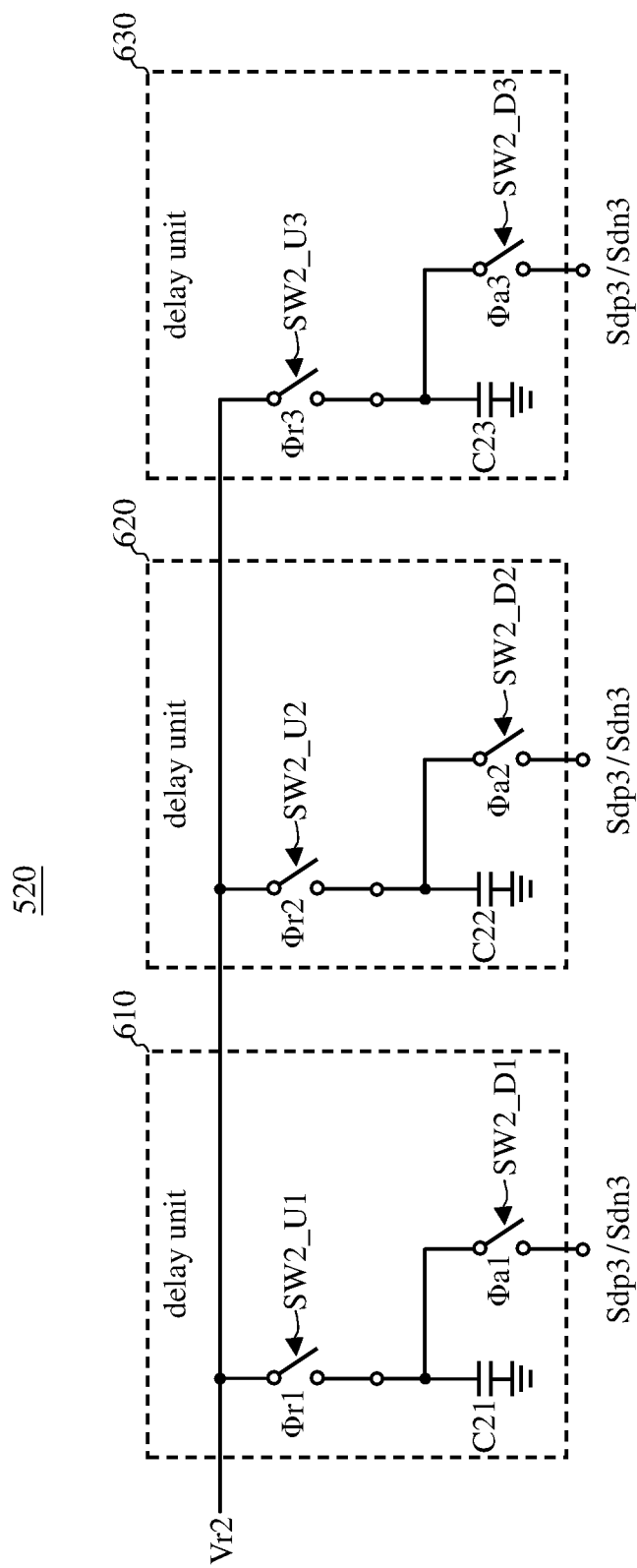
FIG. 6 shows a functional block diagram of a delay circuit according to an embodiment of the present invention.

FIG. 6 shows a functional block diagram of the delay circuit 520 according to an embodiment of the present invention. The delay circuit 520 includes a delay unit 610, a delay unit 620, and a delay unit 630. The delay unit 610 includes a capacitor C21, a switch SW2_U1, and a switch SW2_D1. The delay unit 620 includes a capacitor C22, a switch SW2_U2, and a switch SW2_D2. The delay unit 630 includes a capacitor C23, a switch SW2_U3, and a switch SW2_D3. By controlling the switch of each delay unit, the delay circuit 520 can delay the quantization error signal Vr2 by two unit times (where one unit time is, for example, one period of the clock CLK).

Similar to the delay circuit 520, the delay circuit 510, the delay circuit 530, and the delay circuit 540 having two, four, and five delay units, respectively, delay the quantization error signal Vr2 by one, three, and four unit times, respectively. In the following discussion, the delay circuit 520 is used as an example to illustrate the timing of the switches of the delay unit.

Figure 7:
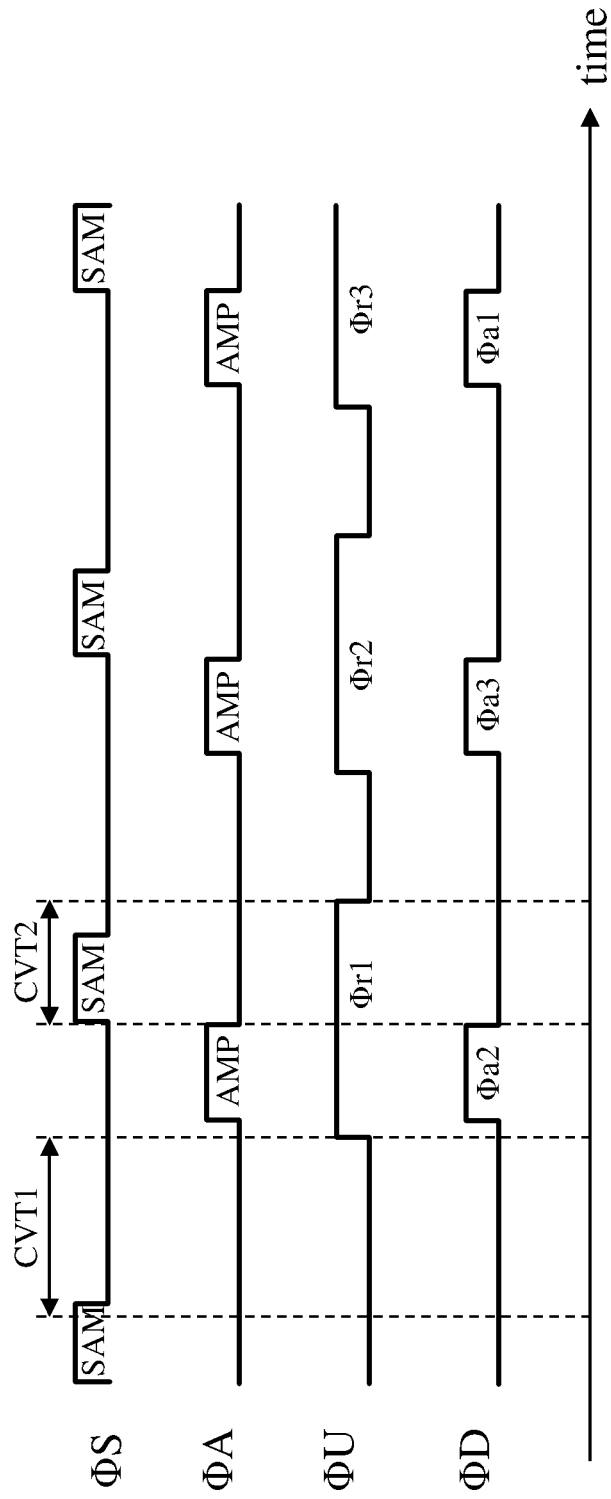
FIG. 7 shows an operation timing sequence of the delay circuit according to one of the embodiments of the present invention.

FIG. 7 shows an operation timing sequence of the delay circuit according to one of the embodiments of the present invention. The pipelined SAR ADC 130 operates according to the clock ΦS and the clock ΦA. "SAM" means that the pipelined SAR ADC 130 samples the intermediate signal Vx1, and "AMP" means that the amplifier 232 performs amplification to output the intermediate signal Vx2. "CVT1" means that the SAR ADC 134 performs A/D conversion on the intermediate signal Vx1, and "CVT2" means that the SAR ADC 136 performs A/D conversion on the intermediate signal Vx2. The switch SW2_U1, the switch SW2_U2, and the switch SW2_U3 operate according to the clock ΦU. The switch SW2_D1, the switch SW2_D2, and the switch SW2_D3 operate according to the clock ΦD. More specifically, the switch SW2_U1 is turned on in the interval Φr1 to sample the quantization error signal Vr2, and the switch SW2_D1 is turned on after two unit times (i.e., in the interval Φa1) to output the signal Sdp3 or the signal Sdn3 (i.e., the delayed quantization error signal Vr2) to the amplifier 232. Similarly, the switch SW2_U2 and the switch SW2_U3 are turned on in the interval Φr2 and the interval Φr3, respectively, and the switch SW2_D2 and the switch SW2_D3 are turned on in the interval Φa2 and the interval Φa3, respectively.

As discussed above, by delaying and amplifying the signal, the delay and amplifier circuit 138 can perform the NTF of the pipelined SAR ADC 130. The circuit in FIG. 3 (or FIG. 4) together with the circuits in FIGS. 5 to 6 can perform a 4th order NTF $H(z)=(1-Z^{-1})^4$. For example, $H(z)=4Z^{-1}-8Z^{-2}+5Z^{-3}-Z^{-4}$ (i.e., A2:A3:A4:A5=4:8:5:1), where the minus sign can be embodied by swapping the input signals (Sdpi and Sdni, i=1, 2, 3, 4, 5) of the corresponding input transistor pair of FIG. 3 or FIG. 4.

The number of input transistor pairs of the amplifier 232 and the number of delay circuits of the delay circuit group 234 correspond to the order of H(z). For example, if the order of H(z) is 3, then the amplifier 232 includes four input transistor pairs, and the delay circuit group 234 includes four delay circuits.

Figure 8:
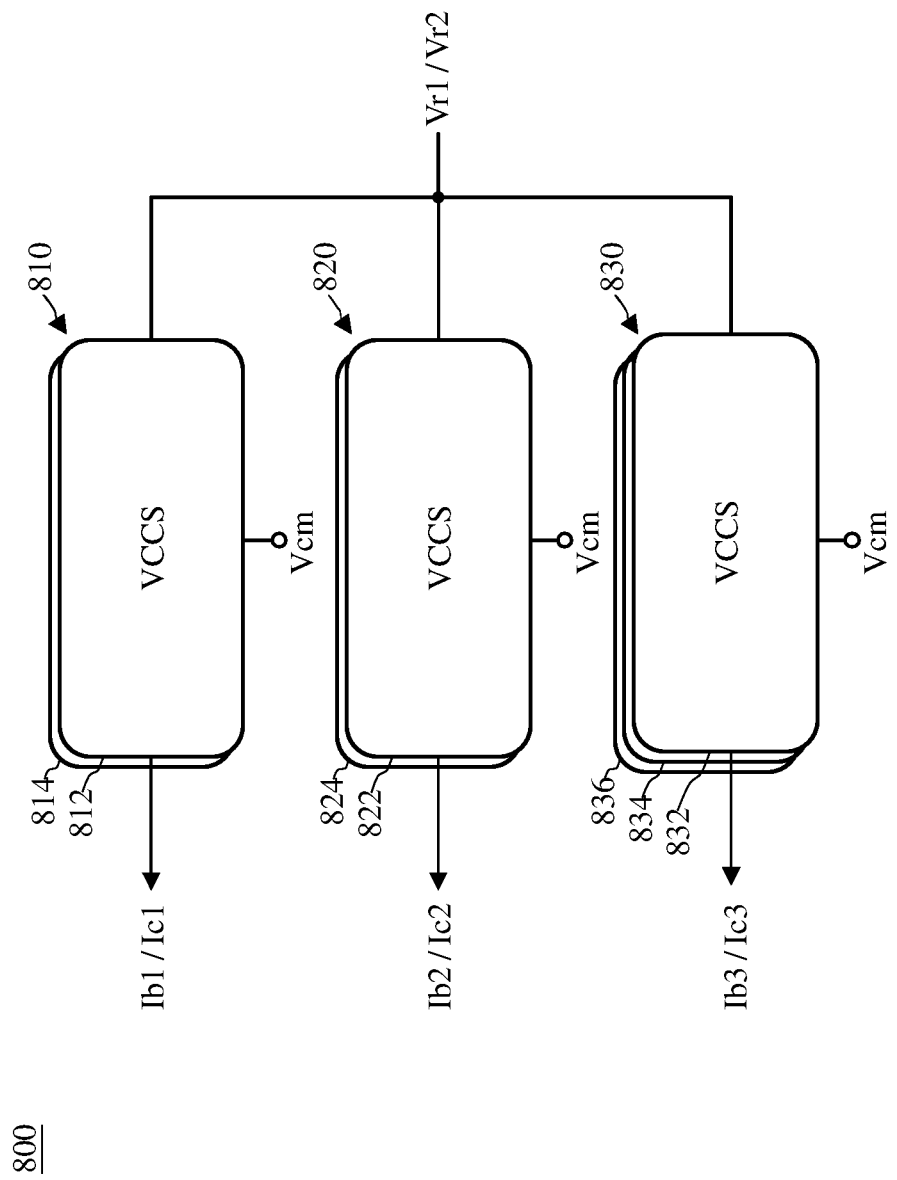
FIG. 8 is a functional block diagram of a voltage-controlled current source (VCCS) group according to an embodiment of the present invention.

FIG. 8 is a functional block diagram of a VCCS group according to an embodiment of the present invention. The VCCS group 154 and the VCCS group 156 can be embodied by the VCCS group 800. The VCCS group 800 includes a VCCS sub-group 810, a VCCS sub-group 820, and a VCCS sub-group 830. The VCCS sub-group 810, the VCCS sub-group 820, and the VCCS sub-group 830 convert the quantization error signal Vr1 (or the quantization error signal Vr2) into a current Ib1 (or a current Ic1), a current Ib2 (or a current Ic2), and a current Ib3 (or a current Ic3), respectively. In reference to FIG. 1, the current Ib1, the current Ib2, and the current Ib3 are each a part of the feedback current Ib, and the current Ic1, the current Ic2, and the current Ic3 are each a part of the feedback current Ic. The current Ib1 and the current Ic1 are outputted to the adder circuit 110, that is, the current Ib1 and the current Ic are part of the feedback signal Ifb. The current Ib2 and the current Ic2 are outputted to the adder circuit 144, that is, the current Ib2 and the current Ic2 are part of the feedback signal Id2. The current Ib3 and the current Ic3 are outputted to the delay circuit 142, that is, the current Ib3 and the current Ic3 are part of the feedback signal Id1.

The VCCS sub-group 810 includes a VCCS 812 and a VCCS 814. The VCCS sub-group 820 includes a VCCS 822 and a VCCS 824. The VCCS sub-group 830 includes a VCCS 832, a VCCS 834, and a VCCS 836. When the VCCS 812 (VCCS 822 or VCCS 832) outputs the current Ib1/Ic1 (current Ib2/Ic2 or current Ib3/Ic3), the VCCS 814 (VCCS 824 or VCCS 834) samples the quantization error signal Vr1 or the quantization error signal Vr2. Because the feedback signal Id1 passes through the delay circuit 142, the VCCS sub-group 830 has one more VCCS (i.e., the VCCS 836) than the VCCS sub-group 810 and the VCCS sub-group 820.

Figure 9:
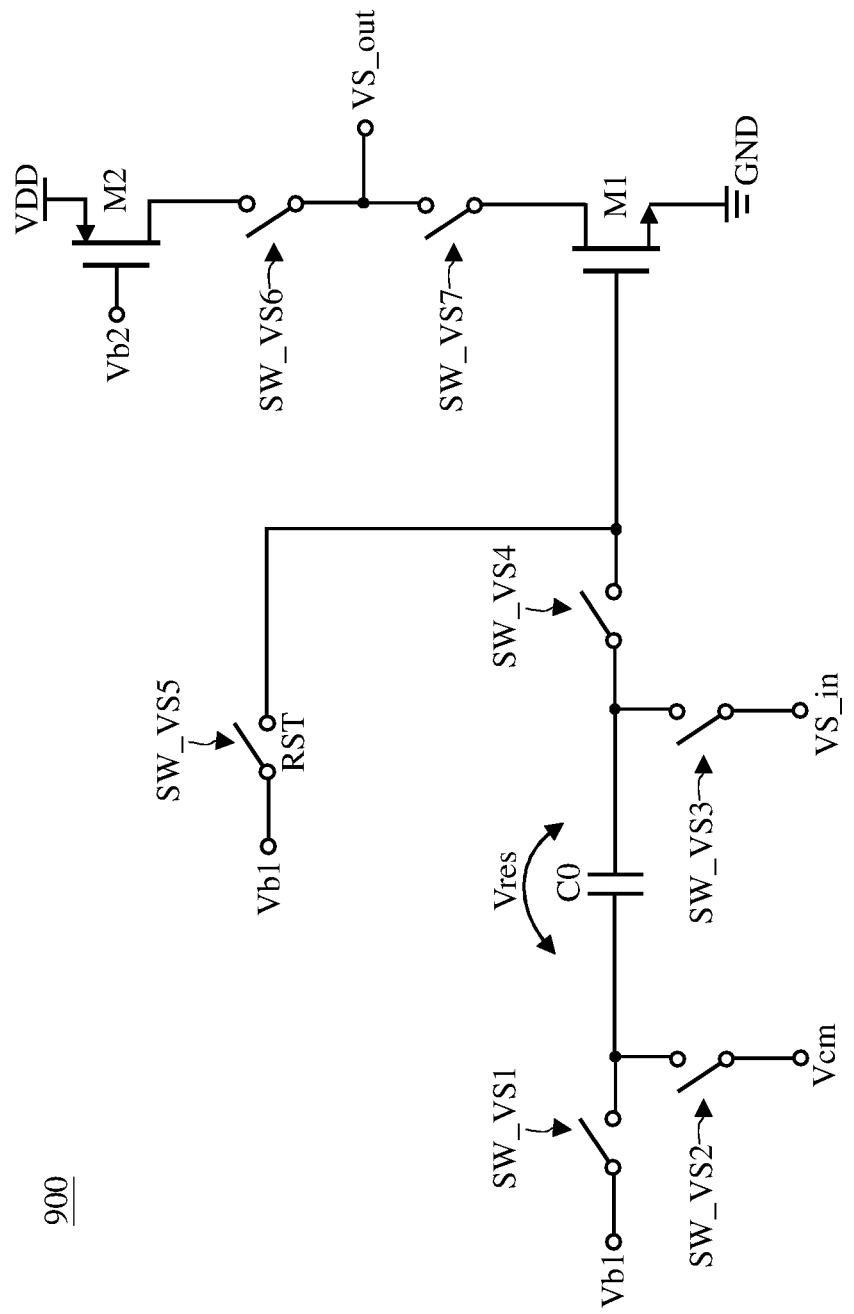
FIG. 9 shows a functional block diagram of a VCCS according to an embodiment of the present invention.

FIG. 9 shows a functional block diagram of a VCCS according to an embodiment of the present invention. The VCCS 900 has an input terminal VS_in and an output terminal VS_out and includes a capacitor C0, a transistor M1, a transistor M2, a switch SW_VS1, a switch SW_VS2, a switch SW_VS3, a switch SW_VS4, a switch SW_VS5, a switch SW_VS6, and a switch SW_VS7. The VCCS 812, the VCCS 814, the VCCS 822, the VCCS 824, the VCCS 832, the VCCS 834, and the VCCS 836 of FIG. 8 may be embodied by the VCCS 900.

The source of the transistor M1 is coupled or electrically connected to a first reference voltage (e.g., ground GND); the drain of the transistor M1 is coupled to the output terminal VS_out through the switch SW_VS7; the gate of the transistor M1 receives the reference voltage Vb1 through the switch SW_VS5. The source of the transistor M2 is coupled or electrically connected to a second reference voltage (e.g., the power supply voltage VDD); the drain of the transistor M2 is coupled to the output terminal VS_out through the switch SW_VS6; the gate of the transistor M2 receives a reference voltage Vb2.

One terminal of the capacitor C0 is coupled to the reference voltage Vb1 through the switch SW_VS1 and coupled to a reference voltage (e.g., a common-mode voltage Vcm of a differential signal pair) through the switch SW_VS2; the other terminal of the capacitor C0 is coupled to the input terminal VS_in through the switch SW_VS3 and coupled to the control terminal of the transistor M1 through the switch SW_VS4.

The input terminal VS_in receives the quantization error signal Vr1 or the quantization error signal Vr2, and the output terminal VS_out outputs a current (i.e., the current Ib1, Ib2, Ib3, Ic1, Ic2, or Ic3). At the end of the conversion operation CVT1 or the conversion operation CVT2 in FIG. 7, the switch SW_VS2 and the switch SW_VS3 are switched from on to off (at this point, the voltage Vres across the capacitor C0 corresponds to the quantization error signal Vr1 or the quantization error signal Vr2). Then, the switch SW_VS1 and the switch SW_VS4 are switched from off to on before the VCCS starts to operate, causing the control terminal of the transistor M1 to completely settle (i.e., the gate voltage of the transistor M1 becomes Vb1+Vres). Finally, the switch SW_VS6 and the switch SW_VS7 are switched on, so that the transistor M1 generates a current Ires (=gm*Vres, where gm=1/R, and R is the resistance value of the resistor of the integrator of the loop filter 120) at the output terminal VS_out according to the voltage Vres. After the VCCS 900 transforms the voltage Vres into the current Ires, the switch SW_VS5 resets the gate voltage of the transistor M1 to the reference voltage Vb1 according to the reset signal RST.

In summary, the CT-DSM of the present invention includes a pipelined SAR ADC 130, so that the number of quantizer bits of the CT-DSM can be increased without increasing the complexity of the circuit.

Although the above circuits (except FIG. 3 and FIG. 4) are illustrated using a single-ended signal as an example, people having ordinary skill in the art can apply the present invention to a differential signal according to the above discussions. In addition, the number of stages of the pipelined SAR ADC 130 of the present invention is not limited to two; pipelined SAR ADCs having more stages are also applicable to the present invention.

Note that the shape, size, and ratio of any element in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A continuous-time delta-sigma modulator (CT-DSM) comprising:
   a loop filter configured to generate a first intermediate signal according to an input signal, a feedback signal, and a compensation signal;
   a pipelined successive-approximation register (SAR) analog-to-digital converter (ADC) coupled to the loop filter and configured to generate a first digital code, a second digital code, a first quantization error signal, and a second quantization error signal according to the first intermediate signal;
   a feedback circuit coupled to the pipelined SAR ADC and configured to generate the feedback signal according to the first digital code, the first quantization error signal, and the second quantization error signal;
   an excess loop delay (ELD) compensation circuit coupled to the feedback circuit and the loop filter and configured to generate the compensation signal according to at least one output signal of the feedback circuit; and
   a logic circuit coupled to the pipelined SAR ADC and configured to generate an output digital code according to the first digital code and the second digital code.

2. The CT-DSM of claim 1, wherein the pipelined SAR ADC comprises:
   a first SAR ADC configured to generate the first digital code and the first quantization error signal according to the first intermediate signal;
   a second SAR ADC configured to generate the second digital code and the second quantization error signal according to a second intermediate signal; and
   a delay and amplifier circuit coupled to the first SAR ADC and the second SAR ADC and configured to generate the second intermediate signal according to the first quantization error signal and the second quantization error signal.

3. The CT-DSM of claim 2, wherein the delay and amplifier circuit comprises:
   a delay circuit group coupled to the second SAR ADC and configured to delay the second quantization error signal to generate a plurality of delayed signals; and
   an amplifier coupled to the delay circuit group and the first SAR ADC and configured to amplify the first quantization error signal and the delayed signals to generate the second intermediate signal.

4. The CT-DSM of claim 3, wherein the amplifier comprises:
   a first switch;
   a second switch;
   a first capacitor;
   a second capacitor;
   a first input transistor pair including a first transistor and a second transistor, wherein the first transistor has a first control terminal, a first source, and a first drain, the second transistor has a second control terminal, a second source, and a second drain, and the first source is coupled to the second source;
   a second input transistor pair including a third transistor and a fourth transistor, wherein the third transistor has a third control terminal, a third source, and a third drain, the fourth transistor has a fourth control terminal, a fourth source, and a fourth drain, and the third source is coupled to the fourth source;
   a fifth transistor having a fifth control terminal, a fifth source, and a fifth drain, wherein the fifth control terminal receives a clock, the fifth drain is coupled to the first drain and the third drain, and the fifth source receives a power supply voltage;
   a sixth transistor having a sixth control terminal, a sixth source, and a sixth drain, wherein the sixth control terminal receives the clock, the sixth drain is coupled to the second drain and the fourth drain, and the sixth source receives the power supply voltage;
   a seventh transistor having a seventh control terminal, a seventh source, and a seventh drain, wherein the seventh control terminal receives a reset signal, the seventh drain is coupled to the first capacitor and coupled to the first drain, the third drain, and the fifth drain through the first switch, and the seventh source receives the power supply voltage;
   an eighth transistor having an eighth control terminal, an eighth source, and an eighth drain, wherein the eighth control terminal receives the reset signal, the eighth drain is coupled to the second capacitor and coupled to the second drain, the fourth drain, and the sixth drain through the second switch, and the eighth source receives the power supply voltage;
   a ninth transistor having a ninth control terminal, a ninth source, and a ninth drain; and
   a tenth transistor having a tenth control terminal, a tenth source, and a tenth drain, wherein the tenth control terminal receives the clock, the tenth drain is coupled to the first source, the second source, the third source, and the fourth source, and the tenth source is coupled to a reference voltage through the ninth transistor.

5. The CT-DSM of claim 4, wherein the amplifier further comprises:
   a third capacitor;
   a fourth capacitor,
   an eleventh transistor having an eleventh control terminal, an eleventh source, and an eleventh drain, wherein the eleventh control terminal is coupled to the sixth drain of the sixth transistor, the eleventh source is coupled to the third capacitor, and the eleventh drain is coupled to the fifth drain of the fifth transistor;
   a twelfth transistor having a twelfth control terminal, a twelfth source, and a twelfth drain, wherein the twelfth control terminal is coupled to the fifth drain of the fifth transistor, the twelfth source is coupled to the fourth capacitor, and the twelfth drain is coupled to the sixth drain of the sixth transistor;
   a thirteenth transistor having a thirteenth control terminal, a thirteenth source, and a thirteenth drain, wherein the thirteenth control terminal receives the clock, the thirteenth drain is coupled to the third capacitor, and the thirteenth source receives the power supply voltage; and
   a fourteenth transistor having a fourteenth control terminal, a fourteenth source, and a fourteenth drain, wherein the fourteenth control terminal receives the clock, the fourteenth drain is coupled to the fourth capacitor, and the fourteenth source receives the power supply voltage.

6. The CT-DSM of claim 3, wherein the delay circuit group comprises:
- a first delay circuit configured to delay the second quantization error signal by a first time period; and
- a second delay circuit configured to delay the second quantization error signal by a second time period;
- wherein the first time period is different from the second time period.

7. The CT-DSM of claim 1, wherein the feedback circuit comprises:
- a current digital-to-analog converter configured to generate a first feedback current according to the first digital code;
- a first voltage-controlled current source (VCCS) group configured to generate a second feedback current according to the first quantization error signal; and
- a second VCCS group configured to generate a third feedback current according to the second quantization error signal.

8. The CT-DSM of claim 7, wherein the first VCCS group or the second VCCS group comprises:
- a first VCCS sub-group configured to generate a first current according to the first quantization error signal or the second quantization error signal;
- a second VCCS sub-group configured to generate a second current according to the first quantization error signal or the second quantization error signal; and
- a third VCCS sub-group configured to generate a third current according to the first quantization error signal or the second quantization error signal;
- wherein the second feedback current or the third feedback current includes the first current, the second current, and the third current, the first current is inputted to the loop filter, and the second current and the third current are inputted to the ELD compensation circuit.

9. The CT-DSM of claim 8, wherein the second VCCS sub-group comprises a plurality of VCCSs, and each VCCS has an input terminal and an output terminal and comprises:
- a first transistor having a first terminal, a second terminal, and a first control terminal, wherein the first terminal is coupled to a first reference voltage;
- a second transistor having a third terminal, a fourth terminal, and a second control terminal, wherein the third terminal is coupled to a second reference voltage, and the second control terminal is coupled to a third reference voltage;
- a capacitor having a fifth terminal and a sixth terminal;
- a first switch coupled between the fifth terminal and a fourth reference voltage;
- a second switch coupled between the fifth terminal and a fifth reference voltage;
- a third switch coupled between the sixth terminal and the input terminal;
- a fourth switch coupled between the sixth terminal and the first control terminal;
- a fifth switch coupled between the fourth reference voltage and the first control terminal;
- a sixth switch coupled between the fourth terminal and the output terminal; and
- a seventh switch coupled between the second terminal and the output terminal.

10. The CT-DSM of claim 9, wherein the second switch and the third switch are turned on simultaneously, the first switch and the fourth switch are turned on simultaneously, and the sixth switch and the seventh switch are turned on simultaneously.

* * * * *